(12) United States Patent
Liu et al.

(10) Patent No.: US 8,168,455 B2
(45) Date of Patent: May 1, 2012

(54) METHOD FOR MANUFACTURING LIGHT EMITTING DIODE

(76) Inventors: Cheng-yi Liu, Jungli (TW); Yung-Hsun Lin, Sanchong (TW)

( * ) Notice: Subject to any disclaimer, the term of this patent is extended or adjusted under 35 U.S.C. 154(b) by 420 days.

(21) Appl. No.: 12/557,023

(22) Filed: Sep. 10, 2009

(65) Prior Publication Data

US 2010/0216270 A1  Aug. 26, 2010

(30) Foreign Application Priority Data

Feb. 20, 2009 (TW) ............................... 98105528 A

(51) Int. Cl.
*H01L 21/00* (2006.01)
(52) U.S. Cl. .................. 438/22; 438/47; 257/E33.001
(58) Field of Classification Search .............. 438/22, 438/47; 257/E33.001
See application file for complete search history.

(56) References Cited

U.S. PATENT DOCUMENTS

| | | | | |
|---|---|---|---|---|
| 5,779,924 | A * | 7/1998 | Krames et al. .................. 216/24 |
| 6,329,667 | B1 * | 12/2001 | Ota et al. .......................... 257/13 |
| 6,614,172 | B2 * | 9/2003 | Chiu et al. ....................... 313/501 |
| 6,900,473 | B2 * | 5/2005 | Yoshitake et al. ............... 257/95 |
| 7,135,348 | B2 * | 11/2006 | Okuyama et al. ................ 438/47 |
| 7,154,125 | B2 * | 12/2006 | Koide et al. ...................... 257/95 |
| 7,399,649 | B2 * | 7/2008 | Miyachi et al. .................. 438/22 |
| 2003/0107047 | A1 * | 6/2003 | Okuyama et al. ................ 257/95 |
| 2003/0173568 | A1 * | 9/2003 | Asakawa et al. ................. 257/79 |
| 2005/0093099 | A1 * | 5/2005 | Koike et al. ..................... 257/615 |
| 2009/0159869 | A1 * | 6/2009 | Ponce et al. ...................... 257/13 |
| 2009/0159870 | A1 * | 6/2009 | Lin et al. .......................... 257/13 |
| 2010/0304516 | A1 * | 12/2010 | Ng ..................................... 438/47 |

* cited by examiner

*Primary Examiner* — Lex Malsawma

(57) ABSTRACT

A method for manufacturing light emitting diode (LED) is revealed. By means of wet etching, a plurality of pyramids is formed on epitaxial structure. The depth of the pyramids is beyond a n-type semiconductor layer, reaching a p-type semiconductor layer. Thus light emitting directions of the LED made by the method of the present invention are increased. Therefore, the light emitting efficiency of LED is improved.

18 Claims, 11 Drawing Sheets

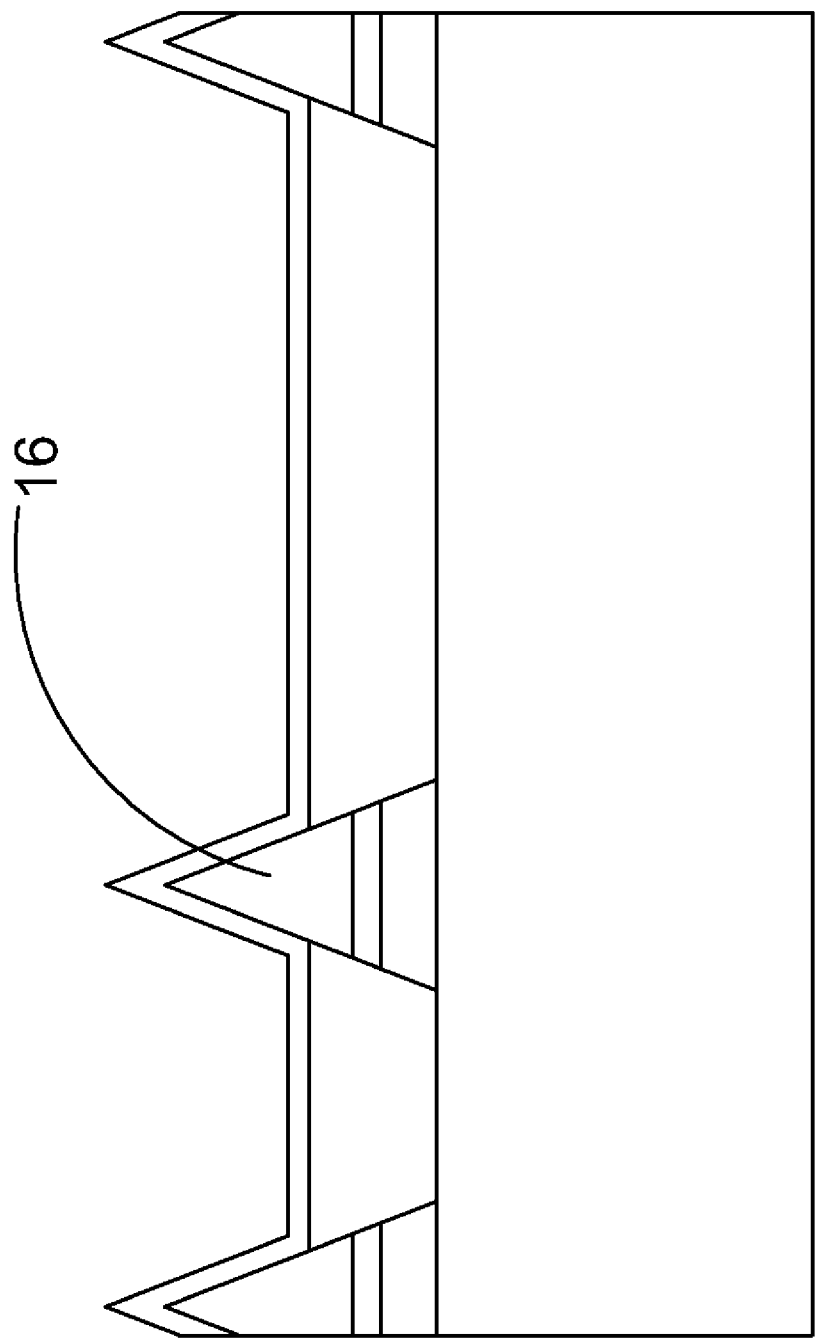

METHOD FOR MANUFACTURING LIGHT EMITTING DIODE

BACKGROUND OF THE INVENTION

1. Field of the Invention

The present invention relates to a method for manufacturing light emitting diode (LED), especially to a method that manufactures the LED by wet etching.

2. Description of Related Art

In the periodic table of the chemical elements, elements of group III and group V are semiconductor materials used as main streams of light sources and photodetector materials. The LED industries in our country already have an excellent foundation for the industry development and the production value of LED has become the world's second largest producer. Thus the required amount of GaN (gallium nitride) blue/green light emitting diode is quite high.

Starting early in 1972, Pankove, as one member of stuff in Radio Corporation of America (RCA) lab, had demonstrated GaN blue light emitting diodes (with metal-insulator-semiconductor structure) successfully. Because the p-type GaN was unable to be made at that time, the LED with a pn junction was still a harder goal to obtain.

In 1981, Japanese scientist Akasaki, professor of Nagoya university, solved the p-type doping dilemma, achieving conducting material with annealed Mg-doped GaN.

In Mg-doped p-type GaN, the doping magnasium is from dicyclopentyl magnasium of organic metal. Then the grown film was irradiated by low energy electron beam for activating the magnesium atoms so as to get p-type Gan layer. By the aluminum nitride used as buffer layer, the p-type GaN layer is grown on sapphire substrate. Thus a first p-n junction blue GaN LED with light intensity of 10 microcandela (mcd) is obtained.

The Dr. Nakamura of nichia company started to work with gasllium nitride in 1989. He modified a conventional commercial Metalorganic Chemical Vapor Deposition (MOCVD) reactor and succeeded in making a two-flow MOCVD reactor to grow high quality GaN crystals. GaN films grown at low temperature are used as buffer layers while dicyclopentyl magnasium is used as a source of p-type doping. Instead of low energy electron beam irradiation of Akasaki, the frown Mg-doped GaN film is heated directly. On March 1991, a first p-n homojunction LED was invented. Then Indium gallium nitride (InGaN) film was grown successfully and high intensity, Double Heterojunction (DH) InGaN LED is obtained on December 1992. Next single-quantum-well LED and multiple-quantum-well LED were tried to grow while AlGaN or GaN were used as blocking layers. In 1994 and 1995, blue LED and green LED with 12 cd light intensity were made. In 1996, a large amount of blue LED was sold.

It is learned from researches of Dr. Nakamura that successfully developed buffer layers, p-type layers, InGaN active layers, and ohmic contact techniques have made a great progress in commercialization of the blue LED. The LED structure evolves from homojunction, heterojunction (even double heterojunction), and finally into single-quantum-well structure as well as multiple-quantum-well structure.

Since the commercialization of LED in 1960, LED has been applied to our daily essentials such as home appliances, indicators of various instruments or light sources due to the features of good shock resistance, long lifetime, low power consumption, and low heat generation. In recent years, various colorful and high intensity LED have been developed so that the applications are expended to outdoor displays such as large-scale outdoor billboards and traffic signs. The three primary colors are red, blue and green. Thus for large-scale outdoor billboards, high intensity blue LED or green LED is indispensable.

In order to increase light emitting efficiency of LED, etching is used to increase roughness of the LED surface. The etching processes include both wet and dry etching. The dry etch process etches anisotropically. Once the epitaxial structure of LED etched by dry etching, a plurality of rectangular blocks is formed on the epitaxial structure. In concept of light extraction, side planes of these rectangular blocks are parallel to one another and this has no help for extracting the light whose incident angle is larger than total reflection angle. As to the wet etching, it is an isotropic process. By the wet etching, a plurality of pyramids are formed on the epitaxial structure. The side planes of those pyramids are not parallel to one another so that light emitting area of LED increases and the light whose incident angle is larger than total reflection angle is also extracted. Thus the light emitting efficiency of LED is improved.

Once the LED is intended to be etched with larger depth, dry etching is used more often. Now the wet etching is only applied to surface roughness of LED with small etching depth. In the present invention, the epitaxial structure of LED is etched by wet etching. By control of the conditions of wet etching, the etching depth is beyond the light emitting layer and a plurality of pyramids is formed on the epitaxial structure so as to increase light emitting directions and area of LED. Therefore, the light emitting efficiency of LED is improved.

SUMMARY OF THE INVENTION

Therefore it is a primary object of the present invention to provide a method for manufacturing light emitting diode that forms a plurality of pyramids on epitaxial structure by wet etching so as to increase light emitting directions and further improve light emitting efficiency of LED.

It is another object of the present invention to provide a method for manufacturing light emitting diode in which conditions of wet etching are controlled so that the depth of wet etched epitaxial structure is beyond the light emitting layer and is reaching the first conductive layer, or even cutting the LED.

In order to achieve above objects, a method for manufacturing LED according to the present invention consists of a plurality of steps. Firstly transfer an epitaxial structure to a transfer substrate. The epitaxial structure includes a first semiconductor layer, a light emitting layer and a second semiconductor layer stacked on the transfer substrate sequentially. Then the epitaxial structure is etched by wet etching from the second semiconductor layer to the first semiconductor layer so as to form a plurality of pyramids on the epitaxial structure. Next a protection (protective) layer is formed on the pyramids of the epitaxial structure. Finally, a transparent electrode layer is formed on the second semiconductor layer as well as the protective layer of the epitaxial structure.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein

FIG. 11 is a schematic drawing showing structure of a further embodiment according to the present invention.

DETAILED DESCRIPTION OF THE PREFERRED EMBODIMENT

Figure 1:
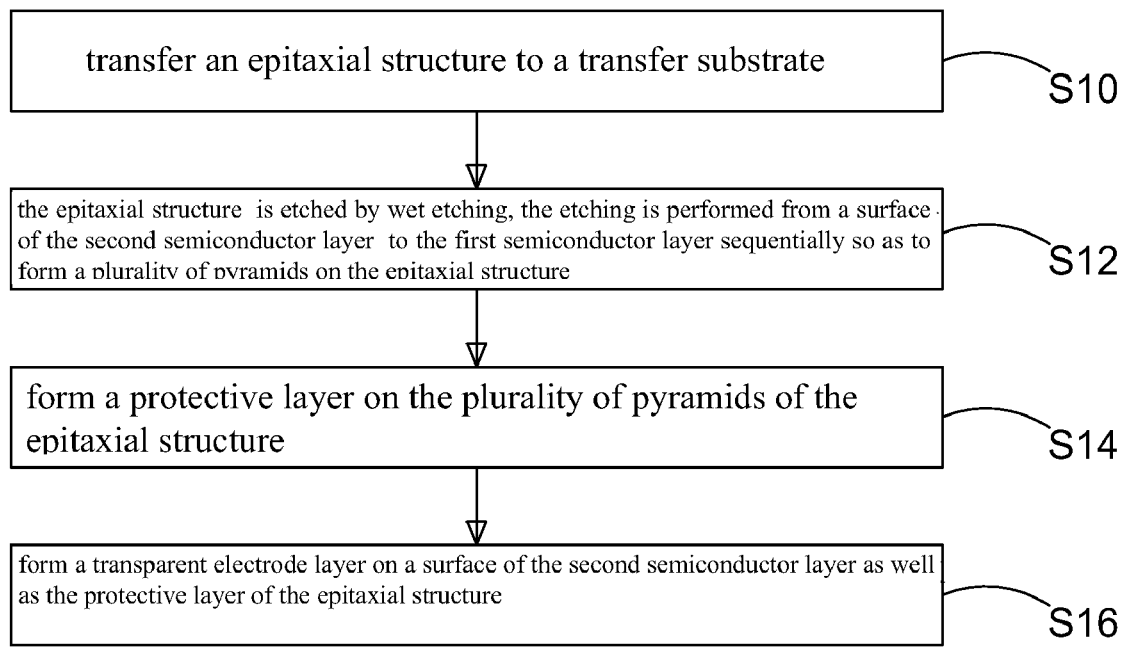
FIG. 1 is a flow chart of an embodiment according to the present invention.
Figure 2:
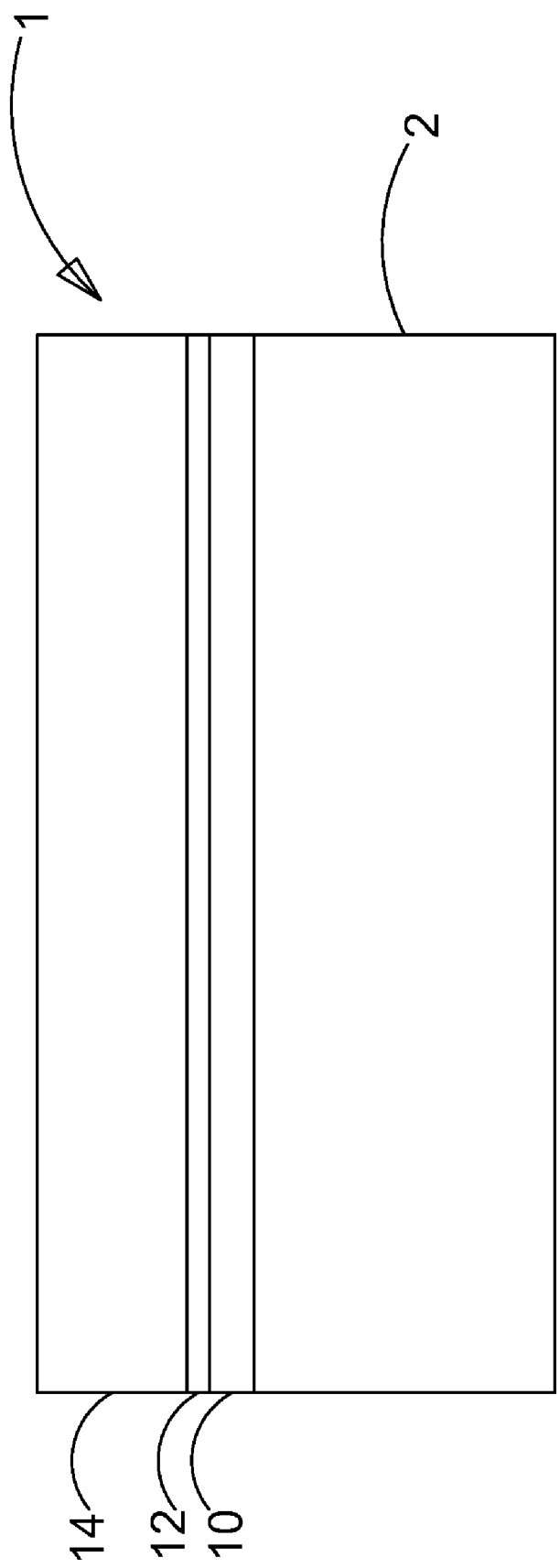
FIG. 2 is a schematic drawing showing the step S10 of the embodiment according to the present invention.

Refer from FIG. 1 to FIG. 7, a flow chart and schematic drawings showing structure of each step of an embodiment according to the present invention are revealed. As shown in figure, a method for manufacturing LED of the present invention includes the following steps: refer to the step S10, transfer an epitaxial structure 1 to a transfer substrate 2. the epitaxial structure 1 is grown on a sapphire. In order to perform wet etching, the epitaxial structure 1 is transferred to the transfer substrate 2. The epitaxial structure 1 includes a first semiconductor layer 10, a light emitting layer 12 and a second semiconductor layer 14. The first semiconductor layer 10 is stacked over the transfer substrate 2, the light emitting layer 12 is disposed over the first semiconductor layer 10 and the second semiconductor layer 14 is stacked over the light emitting layer 12. The electrical properties of the first semiconductor layer 10 and of the second semiconductor layer 14 are opposite. For example, if the first semiconductor layer 10 is p-type, the second semiconductor layer 14 is n-type. On the other hand, if the first semiconductor layer 10 is n-type, the second semiconductor layer 14 is p-type. The first semiconductor layer 10 as well as the second semiconductor layer 14 is made from gallium nitride (GaN), aluminum gallium nitride (AlGaN), indium gallium nitride (InGaN), indium nitride (InN), gallium indium arsenic nitride (GaInAsN), gallium indium phosphide nitride (GaInPN), or nitrides of group III and group V. The light emitting layer 12 is in quantum well structure and is made from gallium nitride (GaN), aluminum gallium nitride (AlGaN), indium gallium nitride (InGaN), indium nitride (InN), gallium indium arsenic nitride (GaInAsN), gallium indium phosphide nitride (GaInPN), or nitrides of group III and group V. The transfer substrate 2 is made from silicon, copper, nickel, aluminum nitride or barium oxide.

Figure 3:
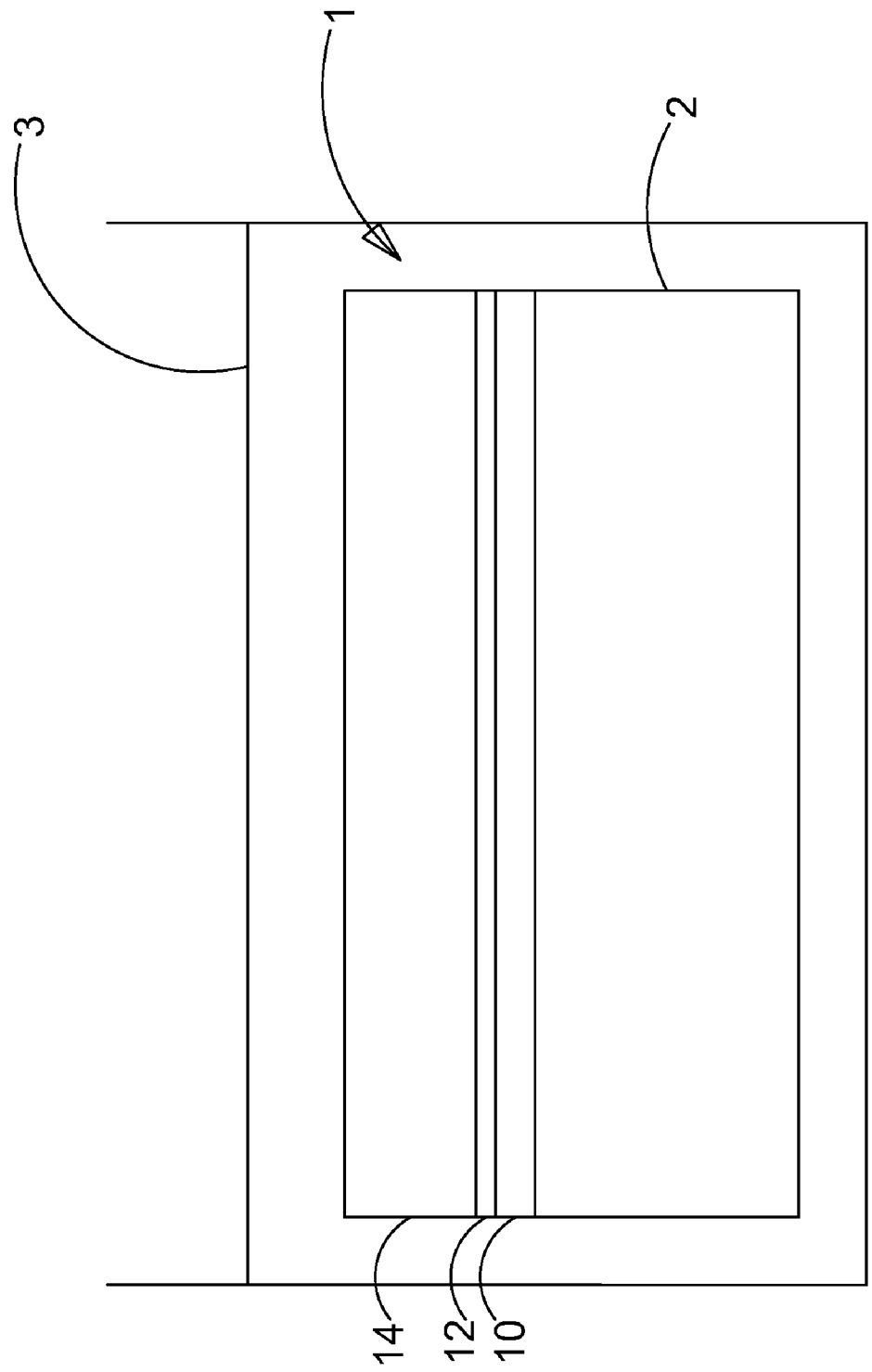
FIG. 3 and FIG. 4 are schematic drawings showing the step S12 of the embodiment according to the present invention.
Figure 4:
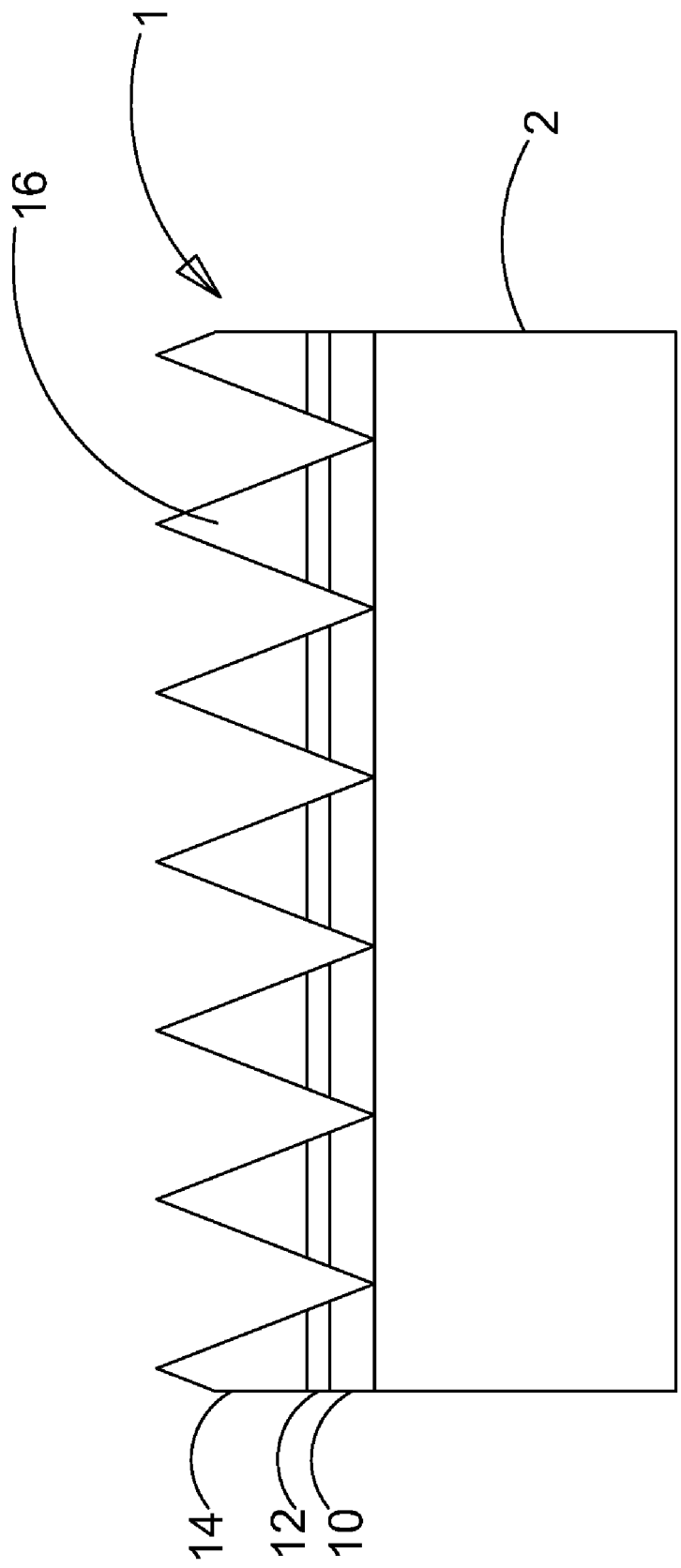

After the epitaxial structure 1 being transferred to the transfer substrate 2, take the step S12—the epitaxial structure 1 is etched by wet etching, as shown in FIG. 3 and FIG. 4. Heat an etchant 3 to an etching temperature that ranges from 100 degrees Celsius to 200 degrees Celsius. The etchant 3 is selected from potassium hydroxide, sodium hydroxide and phosphoric acid. Then soak the epitaxial structure 1 disposed on the transfer substrate 2 into the etchant 3. the epitaxial structure 1 is etched by physical or chemical ways. The etching is performed from a surface of the second semiconductor layer 14 of the epitaxial structure 1 to the first semiconductor layer 10 of the epitaxial structure 1 sequentially so as to form a plurality of pyramids 16 on the epitaxial structure 1. the epitaxial structure 1 is soaked in the etchant for 5 to 10 minutes. After finishing the etching of the epitaxial structure 1, the epitaxial structure 1 disposed on the transfer substrate 2 is taken out from the etchant 3.

According to above steps, the epitaxial structure 1 is etched so that the light emitting layer 12 exposes. If a transparent electrode layer is formed directly on the pyramids 16 of the epitaxial structure 1, current may pass from the second semiconductor layer 14 directly to the first semiconductor layer 10 and don't travel through the light emitting layer 12. Thus the LED won't work. Thus the plurality of pyramids 16 of the epitaxial structure 1 is disposed with a protective layer 18 made from non-conductive material for protection of the light emitting layer 12 of the epitaxial structure 1 so as to avoid the failure of LED caused by the current that doesn't pass the light emitting layer 12.

Figure 5:
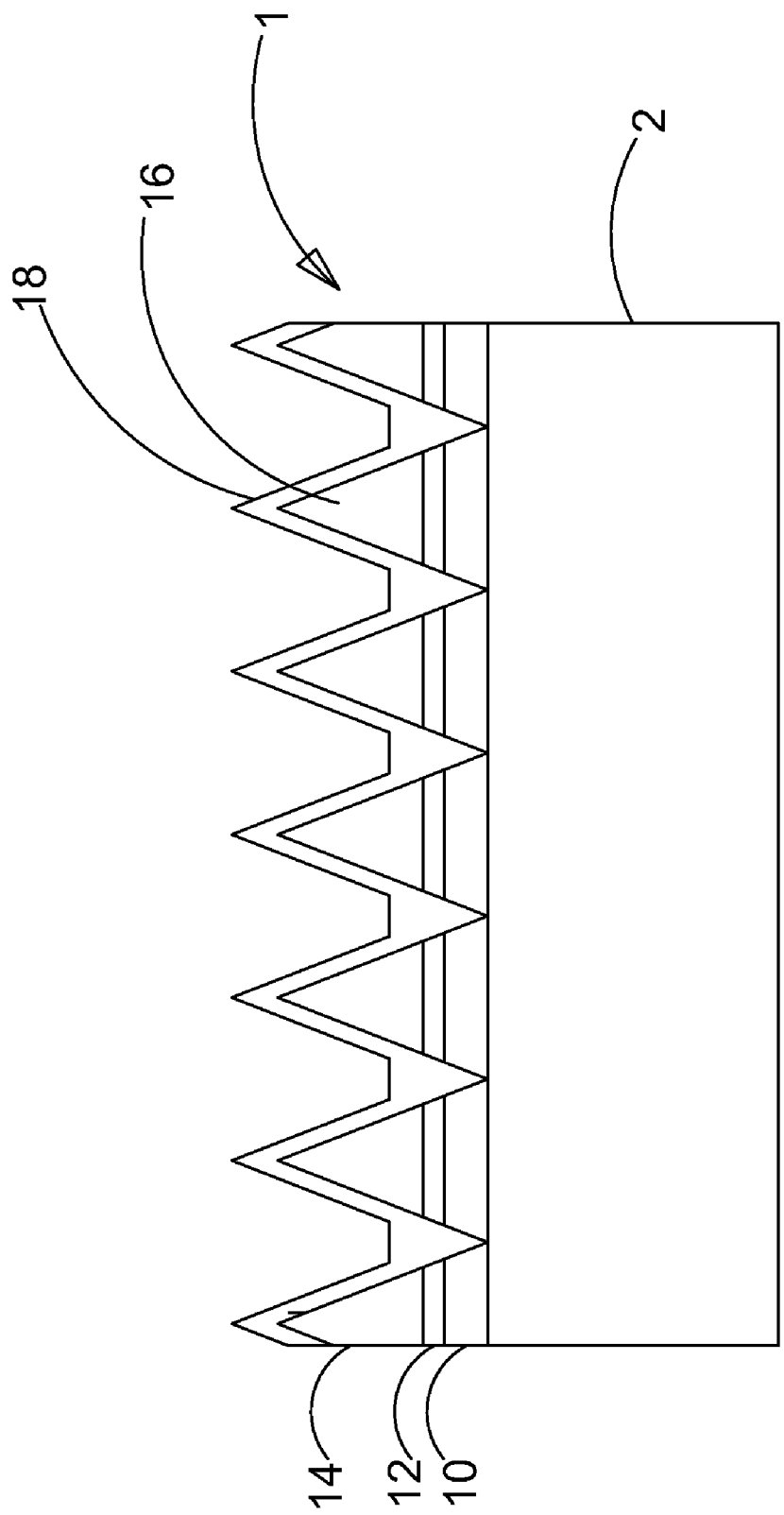
FIG. 5 and FIG. 6 schematic drawings showing the step S14 of the embodiment according to the present invention.
Figure 6:
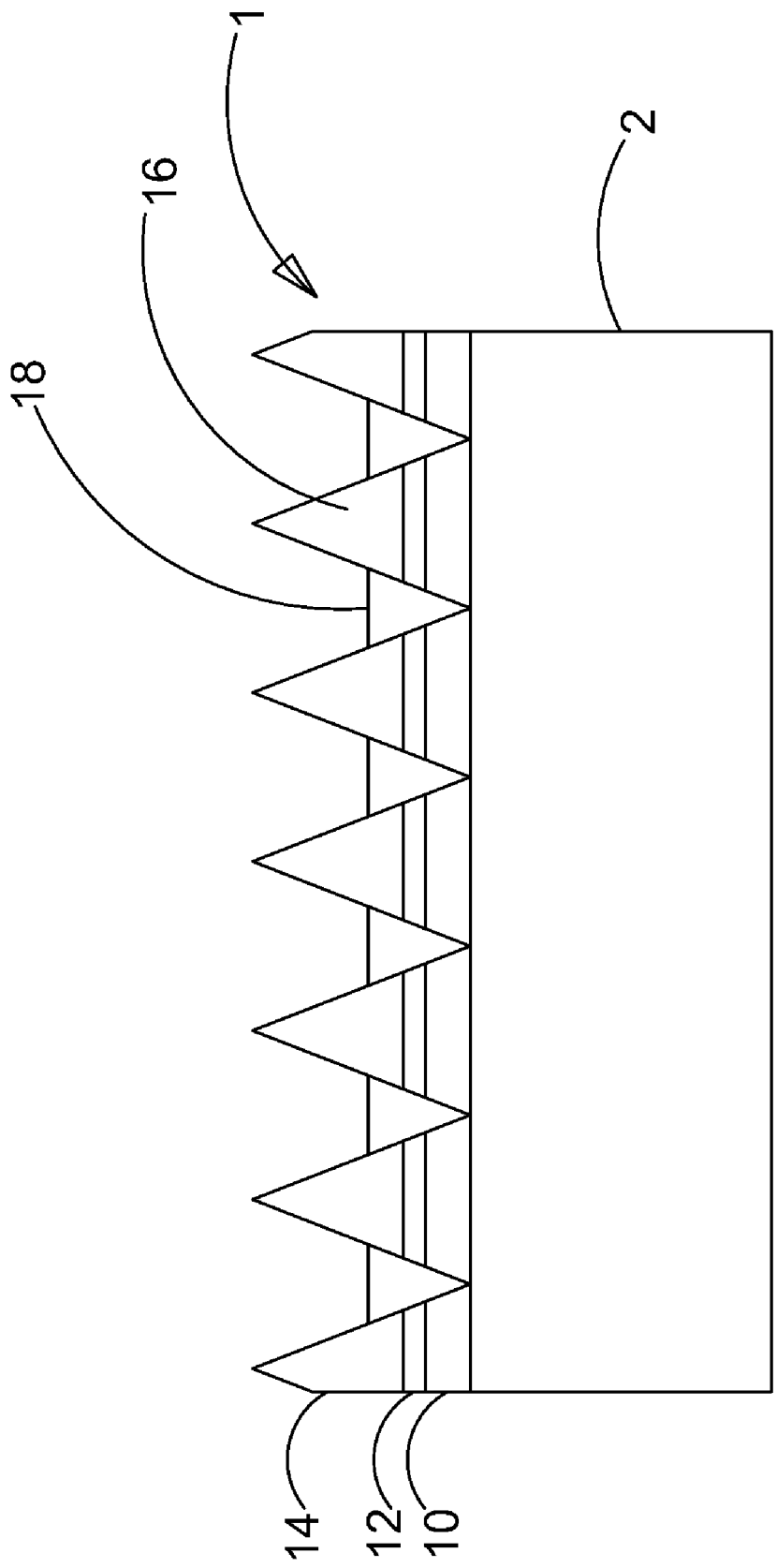

After finishing the etching of the epitaxial structure 1, run the step S14 in FIG. 5 and FIG. 6, form a protective layer 18 on the plurality of pyramids of the epitaxial structure 1. In the beginning, a protective layer 18 is coated on the plurality of pyramids of the epitaxial structure 1 by spin coating. In order to apply current, the second semiconductor layer 14 of the epitaxial structure 1 must expose so that the protective layer 18 on the second semiconductor layer 14 is removed. The protective layer 18 is made from spin-on glass, silicon dioxide, aluminum nitride and silicon nitride.

Figure 7:
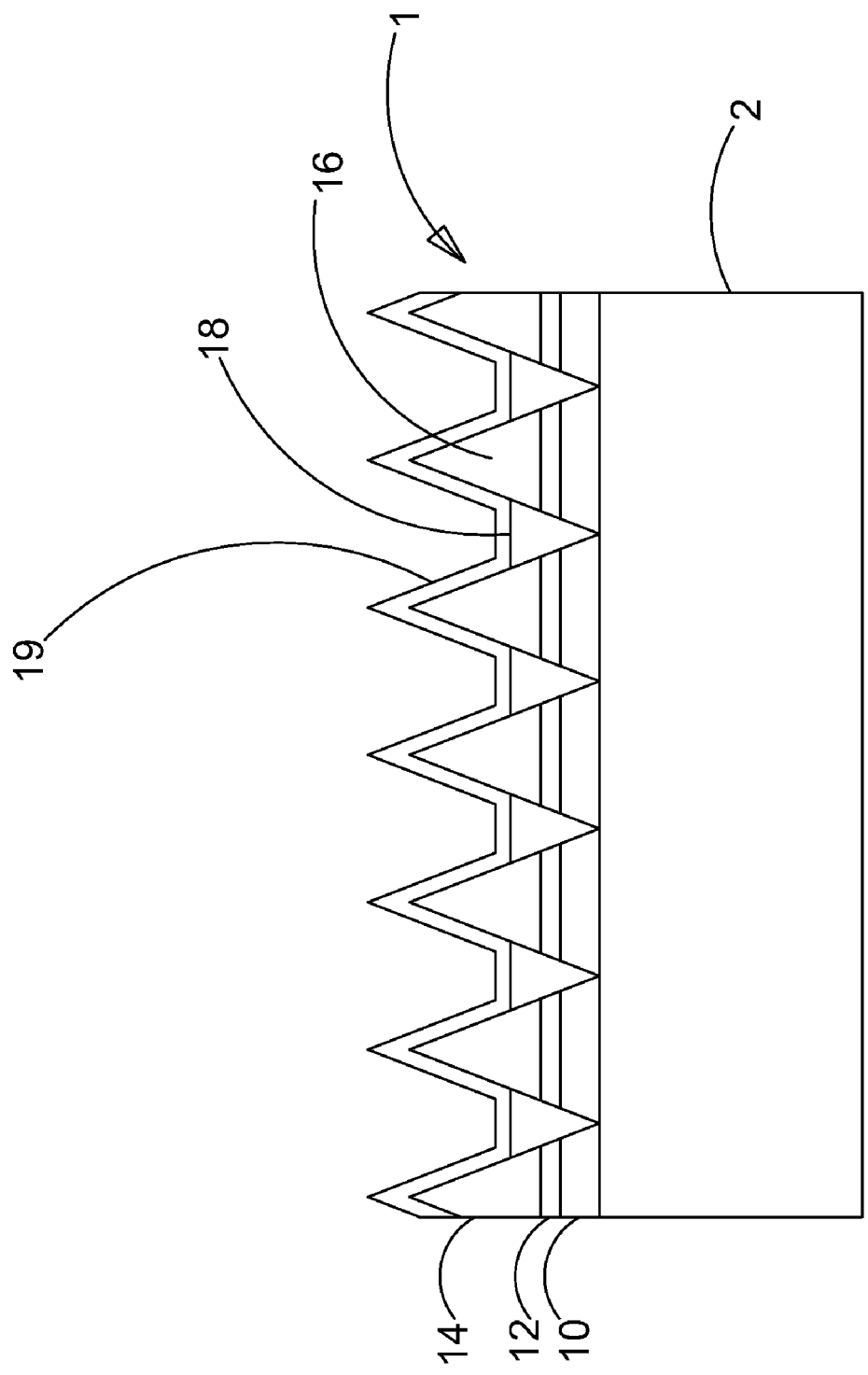
FIG. 7 is a schematic drawing showing the step S16 of the embodiment according to the present invention.

After the protective layer 18 being formed, take the step S16, form a transparent electrode layer 19 on a surface of the second semiconductor layer 14 as well as the protective layer 18 of the epitaxial structure 1, as shown in FIG. 7. The transparent electrode layer 19 is made from indium tin oxide, zinc oxide, aluminum-doped zinc oxide (AZO), and gallium-doped zinc oxide (GZO). The epitaxial structure 1 of the LED prepared by the above steps includes a plurality of pyramids 16 that increase light emitting directions of the LED for improving light emitting efficiency of the LED. Moreover, the large-size LED can be cut by above steps.

Figure 8:
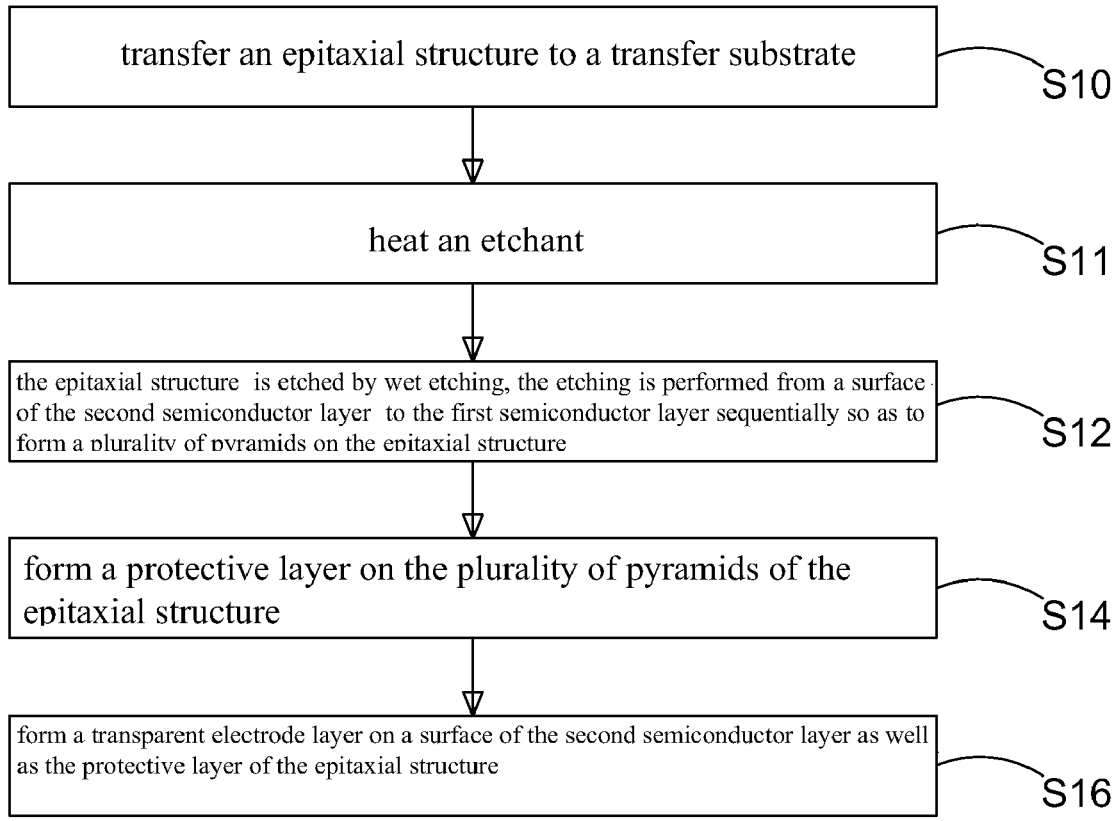
FIG. 8 is a flow chart of another embodiment according to the present invention.

Refer to FIG. 8, a flow chart of another embodiment according to the present invention is disclosed. As shown in figure, a method for manufacturing LED in this embodiment includes the following steps: run the step S10 firstly-transfer an epitaxial structure to a transfer substrate. The epitaxial structure consists of a p-type semiconductor layer (equal to the first semiconductor layer in above embodiment), a light emitting layer and a n-type semiconductor layer (equal to the second semiconductor layer in above embodiment). The p-type semiconductor layer is arranged on the transfer substrate while the light emitting layer and the n-type semiconductor layer are stacked over the p-type semiconductor layer in turn.

Next take the step S11, heat an etchant until the temperature of the etchant reaches 150 degrees Celsius for performing the etching process. The material of the etchant is potassium hydroxide. The potassium hydroxide is mixed with ethyl glycol to form the etchant. After the etchant reaching the required temperature, run the step S12, immerse the transfer substrate with the epitaxial structure into the etchant for performing etching. The epitaxial structure is etched from the n-type semiconductor layer to the p-type semiconductor layer to form a plurality of pyramids. After finishing the etching process, take out the epitaxial structure on the transfer substrate.

Next run the step S14, a material of the protective layer is coated on the plurality of pyramids by spin coating so as to form a protective layer. The material of the protective layer is a spin-on glass (SOG). For applying current to the epitaxial structure, take the step S15, remove the protective layer coated on the n-type semiconductor layer so as to make the n-type semiconductor layer expose.

Finally, take the step S16, form a transparent electrode layer on the n-type semiconductor layer and on the protective layer and the transparent electrode layer is made from indium tin oxide.

Figure 9:
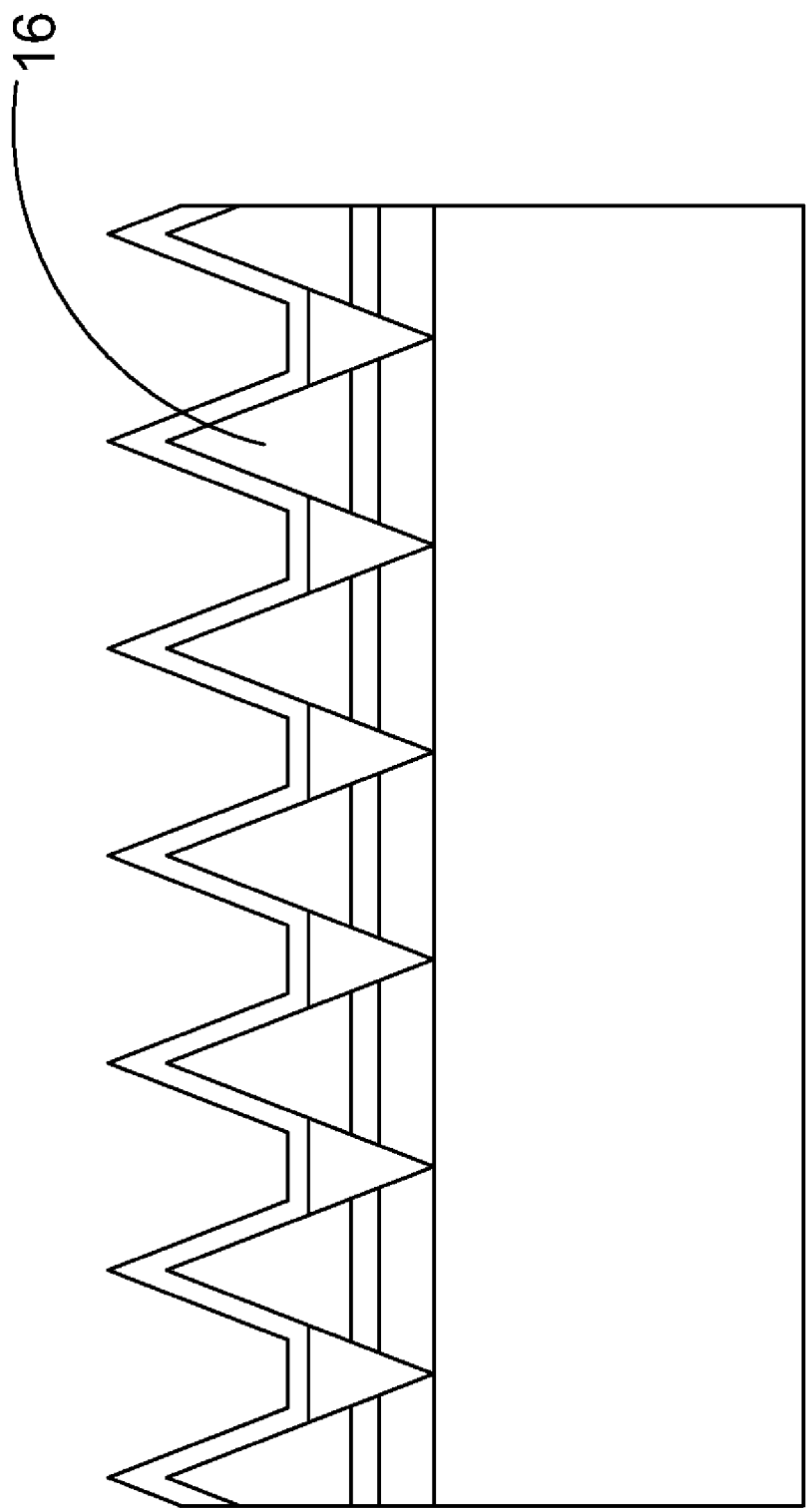
FIG. 9 is a schematic drawing showing structure of another embodiment according to the present invention.

Refer to FIG. 9, a schematic drawing shows structure of a further embodiment according to the present invention. In this embodiment, a LED made by the above method includes a plurality of pyramids 16 of the epitaxial structure. To observe this figure, the plurality of pyramids 16 is continuous and periodic.

Figure 10:
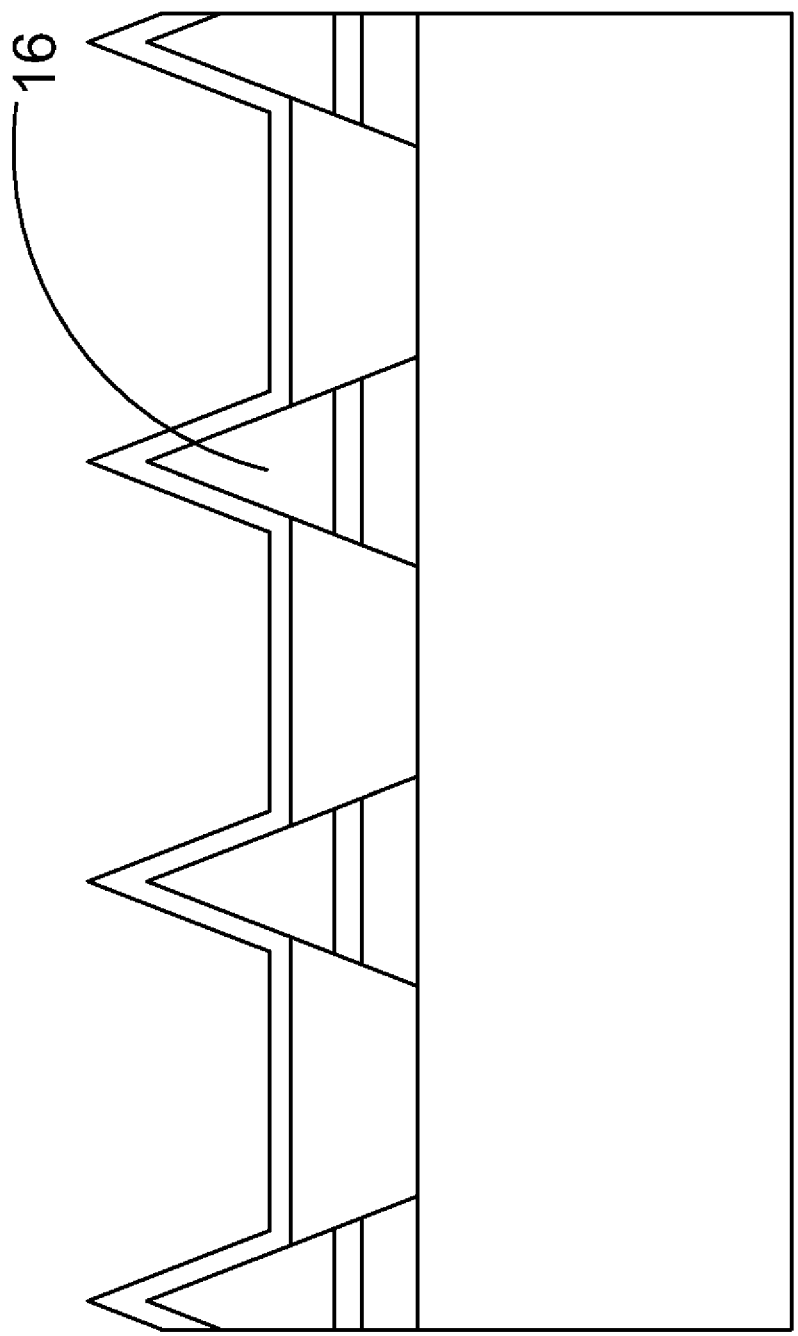
FIG. 10 is a schematic drawing showing structure of a further embodiment according to the present invention.

Refer to FIG. 10, a schematic drawing shows structure of a further embodiment according to the present invention. As shown in figure, a LED made by the above method includes a plurality of pyramids 16 of the epitaxial structure and the plurality of pyramids 16 is discontinuous but is still periodic.

Refer to FIG. 11, a schematic drawings shows structure of a further embodiment of the present invention. A plurality of pyramids 16 of the epitaxial structure of a LED made by the above method is discontinuous and aperiodic.

In summary, a method for manufacturing LED of the present invention forms a plurality of pyramids on the epitaxial structure by wet etching so as to increase light emitting directions and further improve light emitting efficiency of LED. According to conditions of wet etching of the present invention, the etching depth of the epitaxial layer is beyond the light emitting layer, reaching the first semiconductor layer, and even cutting the light emitting diode. Moreover, the present invention protects the light emitting layer by nonconductive protective layer so as to avoid short circuit of the LED.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A method for manufacturing light emitting diode comprising the steps of:
   transferring an epitaxial structure to a transfer substrate and the epitaxial structure having a first semiconductor layer, a light emitting layer and a second semiconductor layer stacked on the transfer substrate in turn;
   wet etching the epitaxial structure, through the second semiconductor layer to the first semiconductor layer and forming a plurality of pyramids on the epitaxial structure;
   forming a protective layer on the plurality of pyramids on the epitaxial structure; and
   forming a transparent electrode layer on the epitaxial structure and on the protective layer.

2. The method as claimed in claim 1, wherein electrical properties of the first semiconductor layer and the second semiconductor layer are opposite.

3. The method as claimed in claim 2, wherein the first semiconductor layer is a p-type semiconductor layer and the second semiconductor layer is a n-type semiconductor layer.

4. The method as claimed in claim 2, wherein the first semiconductor layer is a n-type semiconductor layer and the second semiconductor layer is a p-type semiconductor layer.

5. The method as claimed in claim 1, wherein the transfer substrate is made from silicon, copper, nickel, aluminum nitride or barium oxide.

6. The method as claimed in claim 1, wherein the first semiconductor layer is made from gallium nitride (GaN), aluminum gallium nitride (AlGaN), indium gallium nitride (InGaN), indium nitride (InN), gallium indium arsenic nitride (GaInAsN), gallium indium phosphide nitride (GaInPN), or one of nitrides of group III and group V.

7. The method as claimed in claim 1, wherein the second semiconductor layer is made from gallium nitride (GaN), aluminum gallium nitride (AlGaN), indium gallium nitride (InGaN), indium nitride (InN), gallium indium arsenic nitride (GaInAsN), gallium indium phosphide nitride (GaInPN), or one of nitrides of group III and group V.

8. The method as claimed in claim 1, wherein the light emitting layer is made from gallium nitride (GaN), aluminum gallium nitride (AlGaN), indium gallium nitride (InGaN), indium nitride (InN), gallium indium arsenic nitride (GaInAsN), gallium indium phosphide nitride (GaInPN), or one of nitrides of group III and group V.

9. The method as claimed in claim 1, wherein the step of wet etching the epitaxial structure further comprising the steps of:
   heating an etchant to an etching temperature;
   immersing the epitaxial structure disposed on the transfer substrate into the etchant for etching the epitaxial structural; and
   taking out the epitaxial structure disposed on the transfer substrate after finishing etching.

10. The method as claimed in claim 9, wherein the etching temperature ranges from 100 to 200 degrees Celsius.

11. The method as claimed in claim 9, wherein a period in which the epitaxial structure disposed on the transfer substrate is immersed into the etchant ranges between 5 to 10 minutes.

12. The method as claimed in claim 9, wherein the etchant is selected from potassium hydroxide, sodium hydroxide and phosphoric acid.

13. The method as claimed in claim 1, wherein the protective layer is made from spin-on glass, silicon dioxide, aluminum nitride or silicon nitride.

14. The method as claimed in claim 1, wherein the transparent electrode layer is made from indium tin oxide, zinc oxide, aluminum-doped zinc oxide (AZO), or gallium-doped zinc oxide (GZO).

15. The method as claimed in claim 1, wherein the plurality of pyramids is continuous.

16. The method as claimed in claim 1, wherein the plurality of pyramids is discontinous.

17. The method as claimed in claim 1, wherein the plurality of pyramids is a periodic structure.

18. The method as claimed in claim 1, wherein the plurality of pyramids is an aperiodic structure.

* * * * *